United States Patent
Kaneda et al.

(10) Patent No.: US 12,360,438 B2
(45) Date of Patent: Jul. 15, 2025

(54) ELECTRONIC DEVICE

(71) Applicant: Panasonic Intellectual Property Management Co., Ltd., Osaka (JP)

(72) Inventors: Norikazu Kaneda, Osaka (JP); Masaaki Sasaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 9 days.

(21) Appl. No.: 17/313,611

(22) Filed: May 6, 2021

(65) Prior Publication Data
US 2021/0364887 A1  Nov. 25, 2021

(30) Foreign Application Priority Data
May 21, 2020  (JP) .................................. 2020-088972

(51) Int. Cl.
*G03B 17/02* (2021.01)
*H01M 50/262* (2021.01)
*H01M 50/271* (2021.01)
*H05K 5/02* (2006.01)

(52) U.S. Cl.
CPC .......... *G03B 17/02* (2013.01); *H01M 50/262* (2021.01); *H01M 50/271* (2021.01); *H05K 5/0221* (2013.01)

(58) Field of Classification Search
CPC .... G03B 17/02; H01M 50/262; H05K 5/0221
See application file for complete search history.

(56) References Cited

U.S. PATENT DOCUMENTS

2005/0134216 A1* 6/2005 Tokano ............... H01M 50/213
320/112
2012/0211254 A1 8/2012 Miura

FOREIGN PATENT DOCUMENTS

| JP | H11-250882 A | | 9/1999 |
|---|---|---|---|
| JP | 2001185871 A | * | 7/2001 |
| JP | 2001-223480 A | | 8/2001 |
| JP | 2012-094387 A | | 5/2012 |
| JP | 2012173497 A | | 9/2012 |
| JP | 2014-182980 A | | 9/2014 |
| JP | 2016109727 A | | 6/2016 |

OTHER PUBLICATIONS

Office Action for corresponding Japanese Application No. 2020-088972 dated Jan. 23, 2024 and its English machine translation.

* cited by examiner

*Primary Examiner* — Minh Q Phan
(74) *Attorney, Agent, or Firm* — Renner, Otto, Boisselle & Sklar, LLP

(57) ABSTRACT

An electronic device stores and holds a battery as a drive power source and has a configuration in which the battery can be attached/detached to/from the electronic device. In the electronic device, the battery lid in the electronic device includes a lid plate having a rib, and a lock plate configured to be movable to a first position and a second position with respect to the lid plate, and when the lock plate moves from the first position (non-lock position) to the second position (lock position) with respect to the lid plate, the battery is locked by the battery lock portion and stored and held in a predetermined battery hold position of the battery storage portion, and the battery lid is suppressed from being pressed by the stored and held battery.

5 Claims, 16 Drawing Sheets

ELECTRONIC DEVICE

BACKGROUND

1. Technical Field

The present disclosure relates to an electronic device, more particularly, to an electronic device using a battery as a drive power source.

2. Related Art

Some electronic devices use a battery as a drive power source, and in particular, some small-sized electronic devices have a configuration in which the battery is stored and carried for use in outdoors. For electronic devices having such configuration, various configurations have been proposed for storing and holding the battery. (See JP 11-250882 A, JP 2001-223480 A, JP 2012-094387 A, and JP 2014-182980 A, for example).

Some small-sized electronic devices described above, for example, cameras have a configuration in which a battery serving as a drive power source is attachable/detachable. Such configuration in which the battery is attachable/detachable is required to be capable of securely storing and holding the battery in a predetermined position, as well as ensuring ease of attachment/detachment. If the battery is not stored and held in the predetermined position and is stored in the camera in an unstable state, the drive power source is likely to become unstable in terms of power supply, and an abnormal load by the pressing force from the battery is constantly applied to the battery storage portion of the camera, in particular, the lid for closing the battery storage portion. In some cases, there is a risk that a large impact deforms the lid, and the battery falls out of the camera.

SUMMARY

It is an object of the present disclosure to provide a highly reliable electronic device that stores and holds a battery as a drive power source, wherein the electronic device has a configuration in which a user can easily and surely attach/detach the battery to/from the electronic device, and the battery stored and held in the electronic device does not give an abnormal load or impact to a lid of its battery storage portion.

An electronic device according to an aspect of the present disclosure is an electronic device including: a battery storage portion for storing a battery; a battery lock portion for holding a battery stored in the battery storage portion in a battery hold position; and a battery lid for opening/closing the battery storage portion. The battery lid includes a lid plate having a rib, and a lock plate configured to be movable to a first position and a second position with respect to the lid plate. In a state where the lock plate is in the first position and the battery lid is closed, when the lock plate moves from the first position to the second position with respect to the lid plate, the battery is locked by the battery lock portion and stored and held in a predetermined battery hold position of the battery storage portion, and the battery lid is suppressed from being pressed by the stored and held battery.

According to the present disclosure, it is possible to provide a highly reliable electronic device that stores and holds a battery as a drive power source, and has a configuration in which a battery is easily and surely attachable/detachable, and an abnormal load or impact is not given to a lid of a battery storage portion in which the battery is stored and held.

DETAILED DESCRIPTION OF EMBODIMENTS

Figure 1:
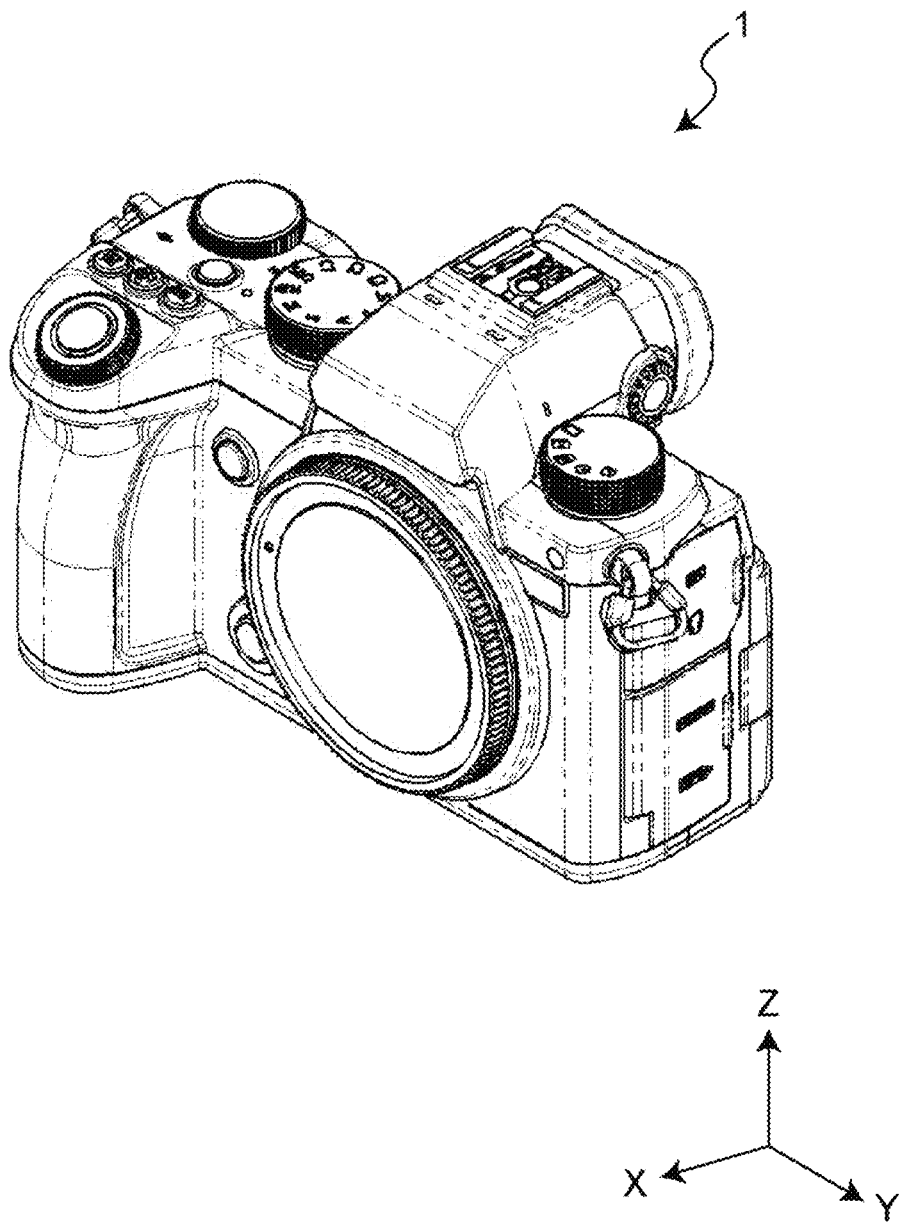
FIG. 1 is a perspective view of a camera according to a first embodiment of the present disclosure.

Hereinafter, as a specific embodiment of the electronic device of the present disclosure, the camera will be described with reference to the accompanying drawings. Note that the electronic device of the present disclosure is not limited to include the configuration of a portable camera described in the following embodiment but includes the configuration of an electronic device based on a technology having equal technical features to those described in the following embodiment.

The shapes, configurations, steps (operations), and order of steps shown in the following embodiment are illustrative, and the invention is not limited to the contents of the present disclosure. Among the components in the following embodiment, components that are not described in the independent claims, which indicate the highest concepts, are described as optional components. Note that in the drawings, for easier understanding, each respective component is sometimes described schematically.

First, various aspects of the electronic device of the present disclosure will be illustrated.

An electronic device according to a first aspect of the present disclosure is an electronic device including: a battery storage portion for storing a battery; a battery lock portion for holding a battery stored in the battery storage portion in a battery hold position; and a battery lid for opening/closing the battery storage portion. The battery lid includes a lid plate having a rib, and a lock plate configured to be movable to a first position and a second position with respect to the lid plate. In a state where the lock plate is in the first position and the battery lid is closed, when the lock plate moves from the first position to the second position with respect to the lid plate, the battery is locked by the battery lock portion and stored and held in a predetermined battery hold position of the battery storage portion, and the battery lid is suppressed from being pressed by the stored and held battery.

In an electronic device according to a second aspect of the present disclosure, the lock plate according to the first aspect may be configured to include a knob portion serving as a handle for moving between the first position and the second position, a press portion that is restricted from moving when in the first position by being supported by the rib of the lid plate, and that is free to move when in the second position, and a lock portion that is engaged with the battery storage portion only when in the second position, and such that when the lock plate is in the first position and the battery lid is closed, the press portion causes the battery to be disposed in the battery hold position with respect to the battery storage portion or in a battery push position where the battery is pushed into from the battery hold position.

In an electronic device according to a third aspect of the present disclosure, the lock plate according to the second aspect may be configured such that, by moving from the second position to the first position with respect to the lid plate, the press portion causes the battery to move to the battery push position from the battery hold position in the battery storage portion, and when the lock plate is in the first position and the lid plate is opened, the battery moves to the battery hold position thereby locking the battery by the battery lock portion.

In an electronic device according to a fourth aspect of the present disclosure, a contact surface between the press portion and the rib is formed by a slope such that the press portion runs on the rib when the lock plate in the second or third aspect moves from the second position to the first position.

In an electronic device according to a fifth aspect of the present disclosure, the press portion in the lock plate of any of the second to fourth aspects may be configured to be provided on a free end side of an elastically deformable rod shape, one side of which is fixed, and the other side of which is a free end, and is supported by the rib of the lid plate in the first position to be capable of pressing the battery in the battery storage portion, and is released from restriction by the rib of the lid plate in the second position to be capable of canceling press of the battery storage portion on the battery.

First Embodiment

Figure 2:
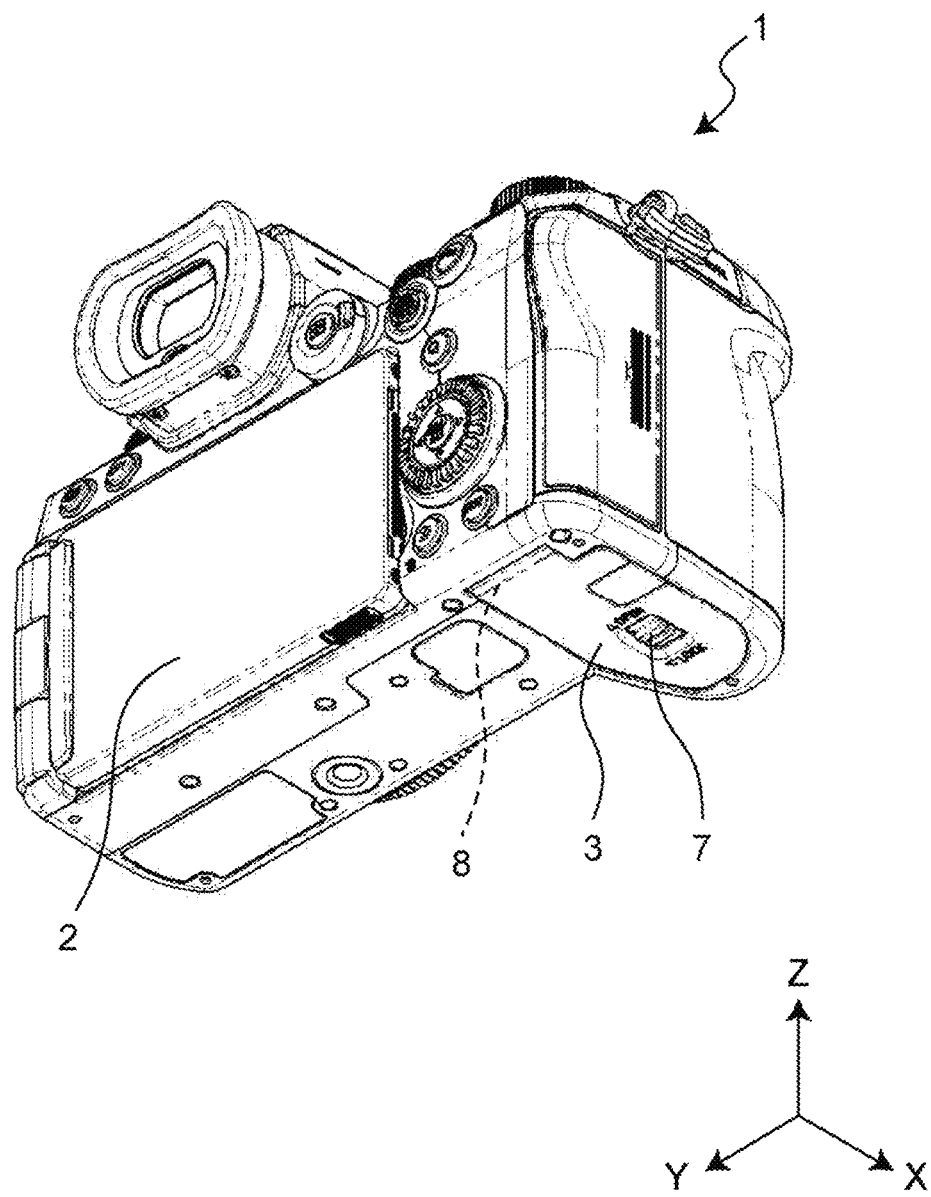
FIG. 2 is a perspective view of the camera according to the first embodiment of the present disclosure.

Hereinafter, a portable camera as an electronic device according to the first embodiment of the present disclosure will be described with reference to the drawings. FIGS. 1 and 2 are perspective views showing a camera 1 of the first embodiment. FIG. 1 is a perspective view of the camera 1 viewed from obliquely above the right front, and FIG. 2 is a perspective view of the camera 1 viewed from obliquely below the left rear.

The perspective views of FIGS. 1 and 2 show an X axis, an Y axis, and an Z axis orthogonal to one another for the sake of convenience, and in the camera 1 of the first embodiment, they are described as a front-rear direction (X axis direction), a left-right direction (Y axis direction), and an up-down direction (Z axis direction). In the description of the camera 1 of the first embodiment, a lens mount side (subject side) of the camera 1 shown in FIG. 1 on which the lens is mounted is defined as the front side, and the right side and the left side are defined with the camera 1 viewed from the front side. As shown in FIG. 2, a display monitor 2 composed of a liquid crystal display device or an organic EL device is provided on the back surface side of the camera 1 of the first embodiment.

Figure 3:
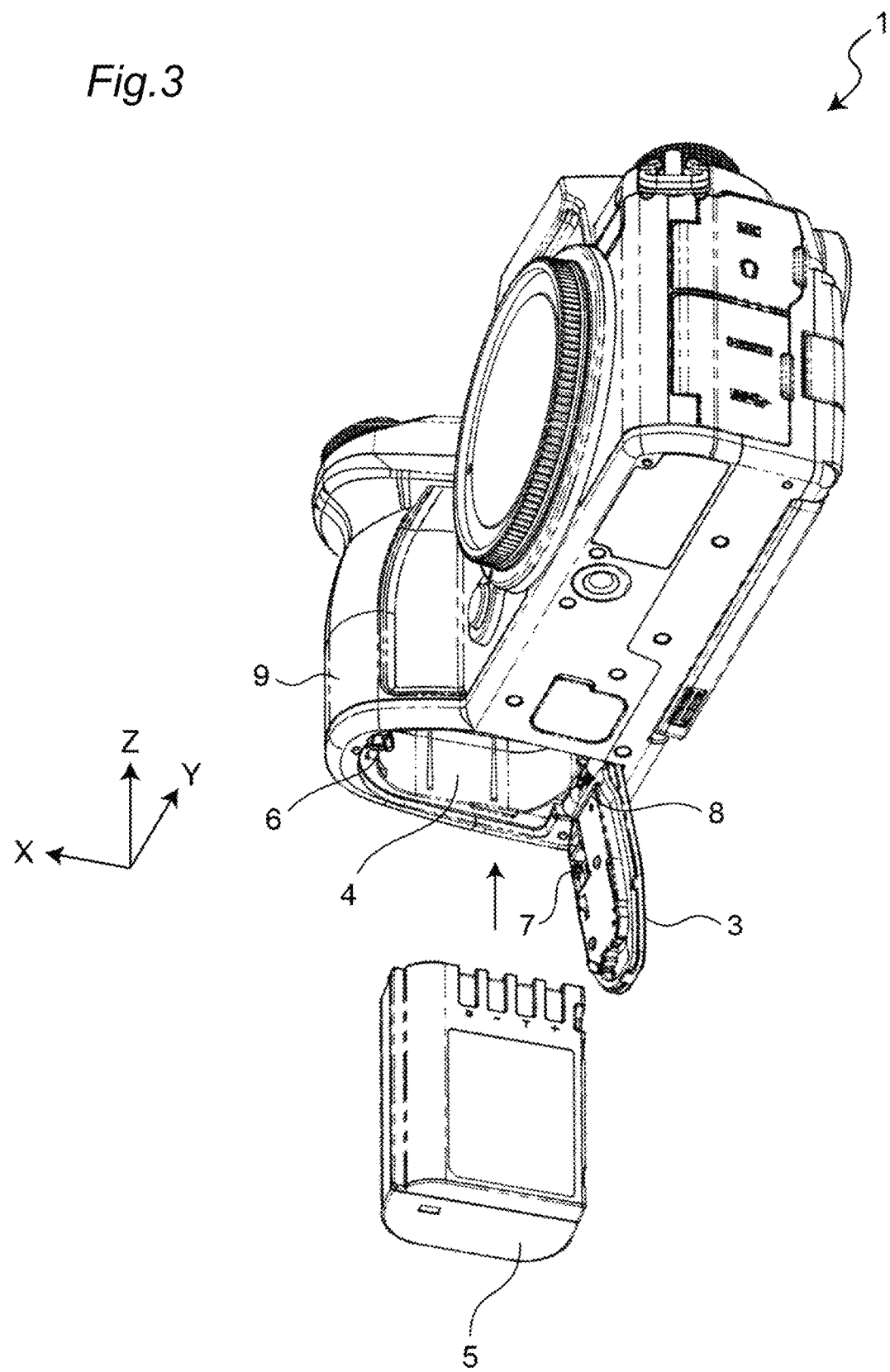
FIG. 3 is a perspective view showing a state in which the camera according to the first embodiment of the present disclosure is being stored.

In the camera 1 of the first embodiment, as shown in the perspective view of FIG. 2, a battery lid 3 is provided on the bottom surface on the left side. FIG. 3 is a perspective view of the camera 1 as viewed from the front lower side, and is a view mainly showing the bottom surface side of the camera 1. As shown in FIG. 3, a battery storage portion (battery storage space) 4 for storing and holding a battery 5 serving as a drive power source is formed inside the left side of the camera 1. The battery lid 3 closes the battery storage portion 4 to bring into a lock state, thereby causing the internal space of the battery storage portion 4 to be a drip-proof, sealed space.

As shown in FIG. 3, the battery lid 3 is joined to a camera casing 9 by a hinge portion 8 provided on the rear side of the battery storage portion 4 so as to be openable and closable, and is biased in a direction in which the battery lid 3 is always opened. A battery hold claw 6, which is a battery lock portion, is disposed on the front side of the battery storage portion 4. The battery hold claw 6 locks the lower end (bottom end portion of the battery 5 shown in FIG. 3) of the battery 5 disposed inside the battery storage portion 4, and stores and holds the battery 5 in a predetermined position (battery hold position) inside the battery storage portion 4. The battery hold claw 6 has an elastic structure in which, in order to be surely engaged with the lower end of the battery 5 when the battery is stored, the battery hold claw 6 is pushed into the camera 1 when the side surface of the battery 5 slides, and the battery hold claw 6 protrudes to be engaged with the lower end of the battery 5 when the side surface sliding of the battery 5 ends and the lower end of the battery 5 reaches. That is, the battery hold claw 6, which is a battery lock portion, is configured to be biased in a direction protruding inside the battery storage portion 4, and is pressed against the side surface of the battery 5 and pushed into the camera 1 only in the middle of the storing operation of the battery 5.

Figure 4:
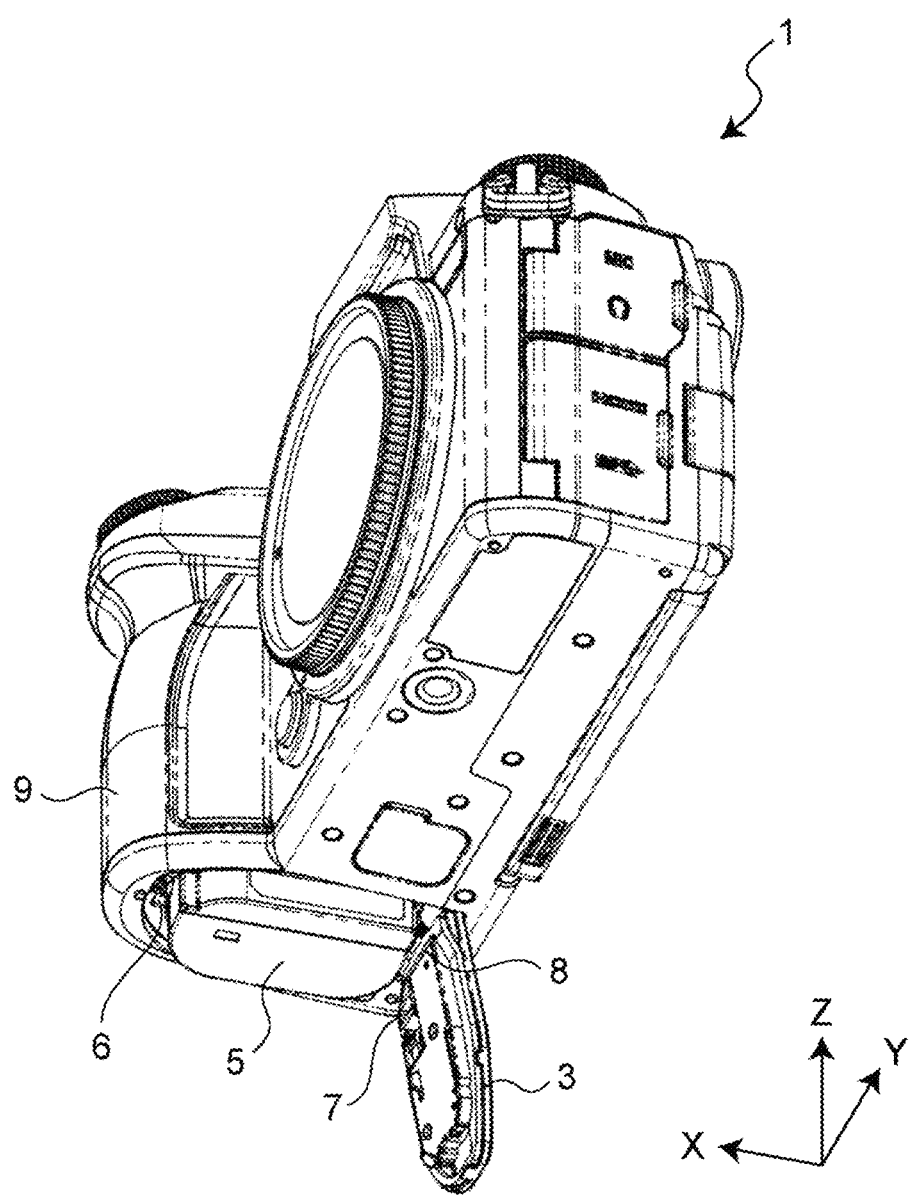
FIG. 4 is a perspective view showing a state in which the camera according to the first embodiment of the present disclosure is being stored.
Figure 5:
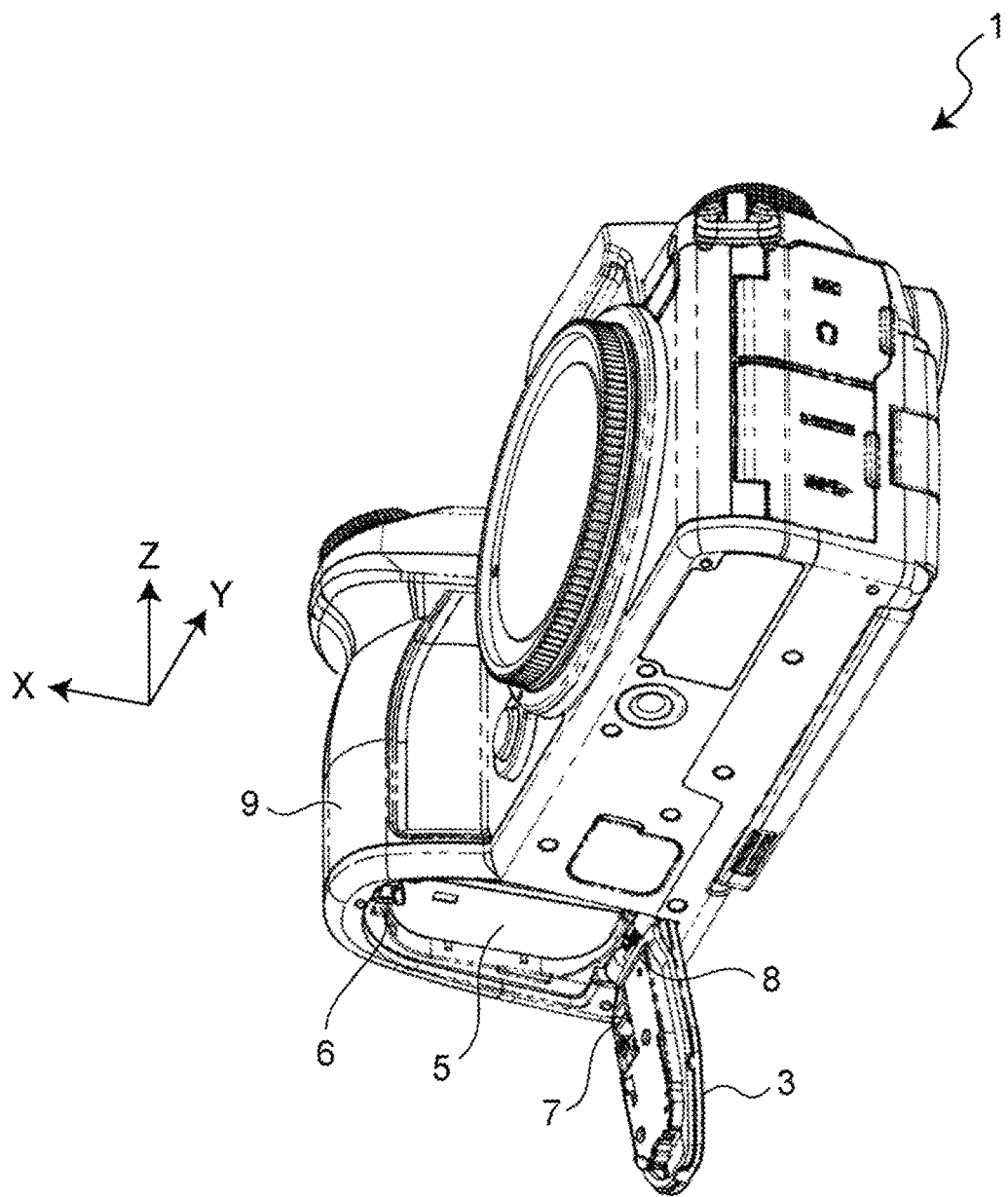
FIG. 5 is a perspective view showing a state in which the camera according to the first embodiment of the present disclosure is being stored.

FIG. 4 is a perspective view showing a state in the middle of storing in the storing operation of the battery 5. FIG. 5 shows a state in which, in the storing operation of the battery 5, the battery 5 is disposed in a predetermined position (battery hold position) inside the battery storage portion 4, and the battery hold claw 6 is engaged with the bottom end portion, which is the lower end of the battery 5. As shown in FIG. 5, the battery 5 is securely held inside the battery storage portion 4 by the battery hold claw 6.

Figure 6A:
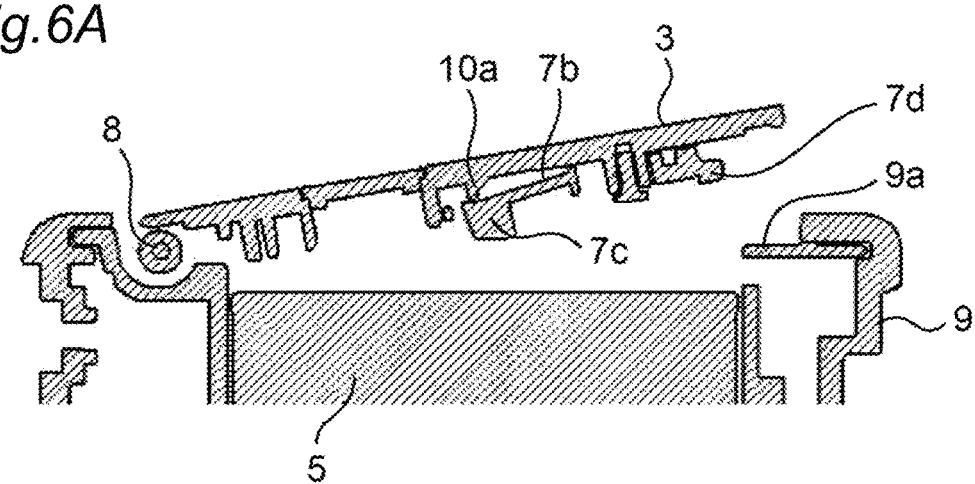
FIGS. 6A to 6C are cross-sectional views showing a lock operation of the camera according to the first embodiment of the present disclosure.
Figure 6B:
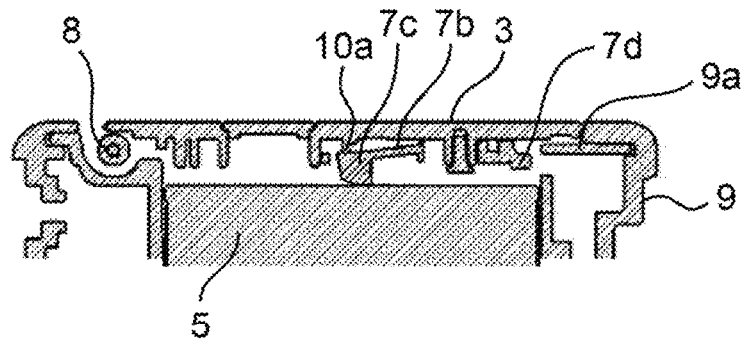
Figure 6C:
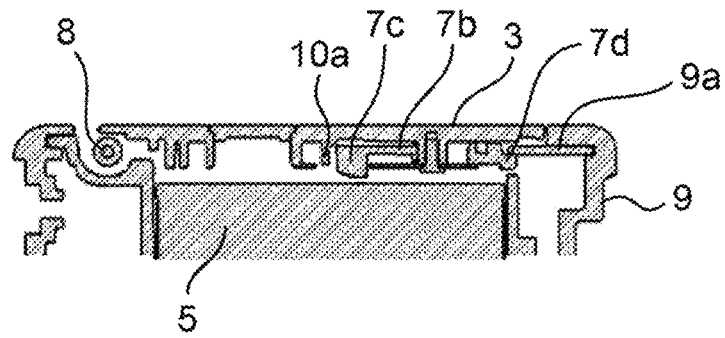

In a state where the battery 5 shown in FIG. 5 is held in the battery hold position by the battery hold claw 6, the battery lid 3 is closed and locked, and thus the battery 5 is securely stored and held inside the camera 1. FIGS. 6A to 6C are cross-sectional views showing a lock operation by which the battery lid 3 is closed from the state shown in FIG. 5 and the battery lid 3 is locked to the camera casing 9. The cross-sectional views of FIGS. 6A to 6C show the bottom surface side of the battery storage portion 4 of the camera casing 9, with the bottom surface side of the battery storage portion 4 being the upper side.

In FIGS. 6A to 6C, FIG. 6A is a cross-sectional view showing a state immediately before the battery lid 3 is closed, FIG. 6B shows a close state immediately after the battery lid 3 closes the battery storage portion 4, and FIG. 6C shows a state where the battery lid 3 is locked to the camera casing 9. The close state shown in FIG. 6B is a non-lock state where the battery lid 3 is not locked to the camera casing 9 yet and a lock plate 7, which will be described later, is in an "OPEN" position (first position: non-lock position). The state shown in FIG. 6C is a lock state where the battery lid 3 is locked to the camera casing 9 and the lock plate 7 is in a "LOCK" position (second position: lock position).

Figure 7A:
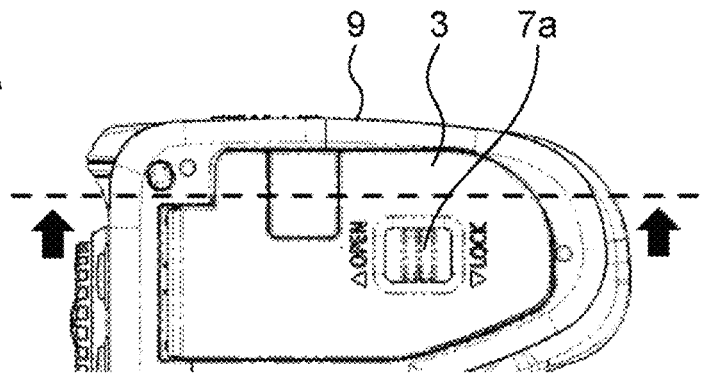
FIGS. 7A to 7C are partial views showing a configuration of a battery lid, a battery storage portion, and the like in the camera according to the first embodiment of the present disclosure.
Figure 7B:
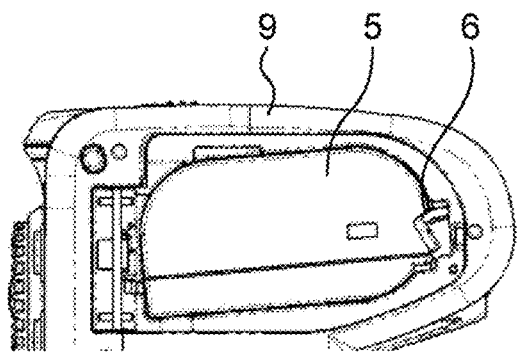
Figure 7C:
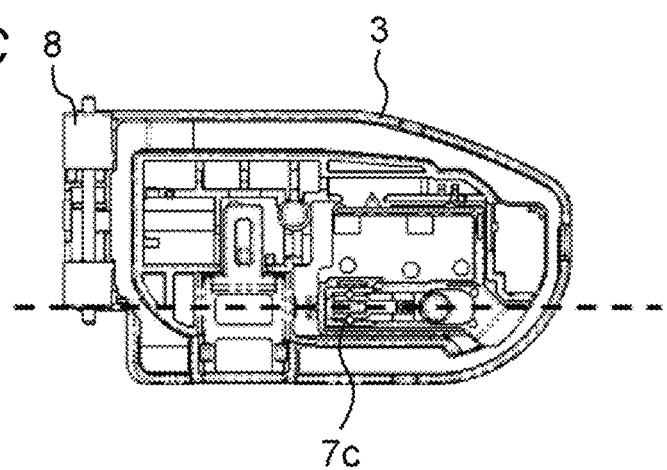

FIGS. 7A to 7C are partial views showing the configuration of the battery lid 3 locked to the camera casing 9, the battery storage portion 4 in which the battery 5 is stored and held, and the like. FIG. 7A is a bottom view showing a state in which the battery lid 3 is locked to the camera casing 9. In FIG. 7A, a line segment indicated by the broken line indicates the cross-sectional position of the cross-sectional views of FIGS. 6A to 6C described above. FIG. 7B shows a state in which the battery lid 3 is removed, and shows a state in which the bottom end portion of the battery 5 stored and held in the battery storage portion 4 is engaged with the battery hold claw 6. FIG. 7C shows the battery lid 3 excluding a lid back plate 11 in order to make the back surface configuration of the battery lid 3 easy to see, and shows the inner surface side (back surface side) of the battery lid 3. The line segment indicated by the broken line in FIG. 7C indicates the cross-sectional position of the cross-sectional views of FIGS. 6A to 6C, similarly to the line segment of the broken line in FIG. 7A.

As shown in FIG. 7A, a knob portion 7a of the lock plate 7 is exposed on the back surface side of the battery lid 3. The knob portion 7a of the lock plate 7 has a function as a handle, and has a function of switching the battery lid 3 to the non-lock state or the lock state by a user operation. In FIGS. 6A to 6C, the state shown in FIG. 6A is the open state, and the state shown in FIG. 6B is the close state and the non-lock state. The states shown in FIGS. 6A and 6B show the case where the knob portion 7a of the lock plate 7 is in the "OPEN" position, which is the first position. On the other hand, in the lock state shown in FIG. 6C, the knob portion 7a is in the "LOCK" position, which is the second position. The lock mechanism of the lock plate 7 and its lock operation will be described later in detail with reference to FIGS. 10 to 16.

Figure 8:
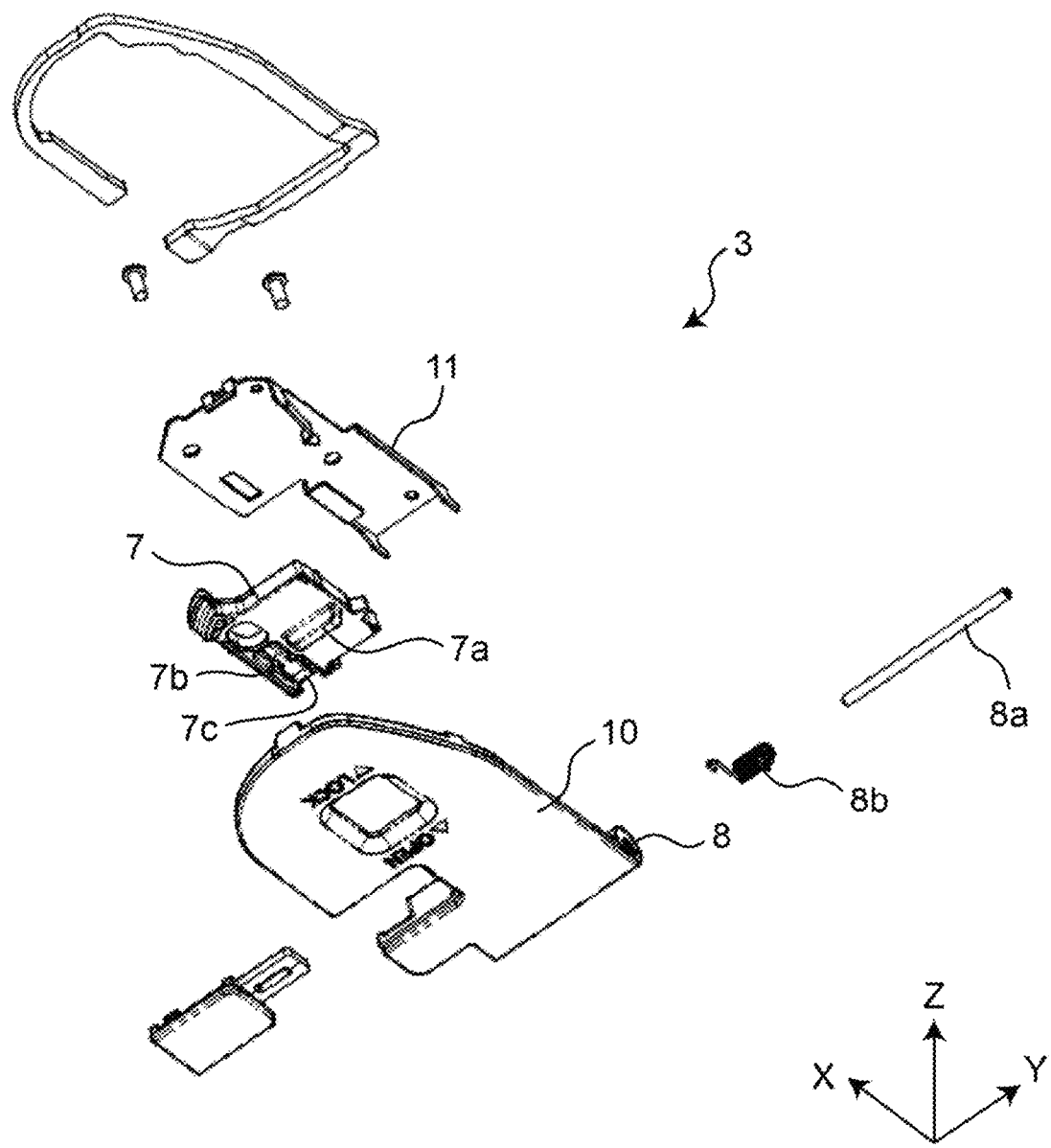
FIG. 8 is an exploded perspective view of the battery lid in the camera according to the first embodiment of the present disclosure.
Figure 9:
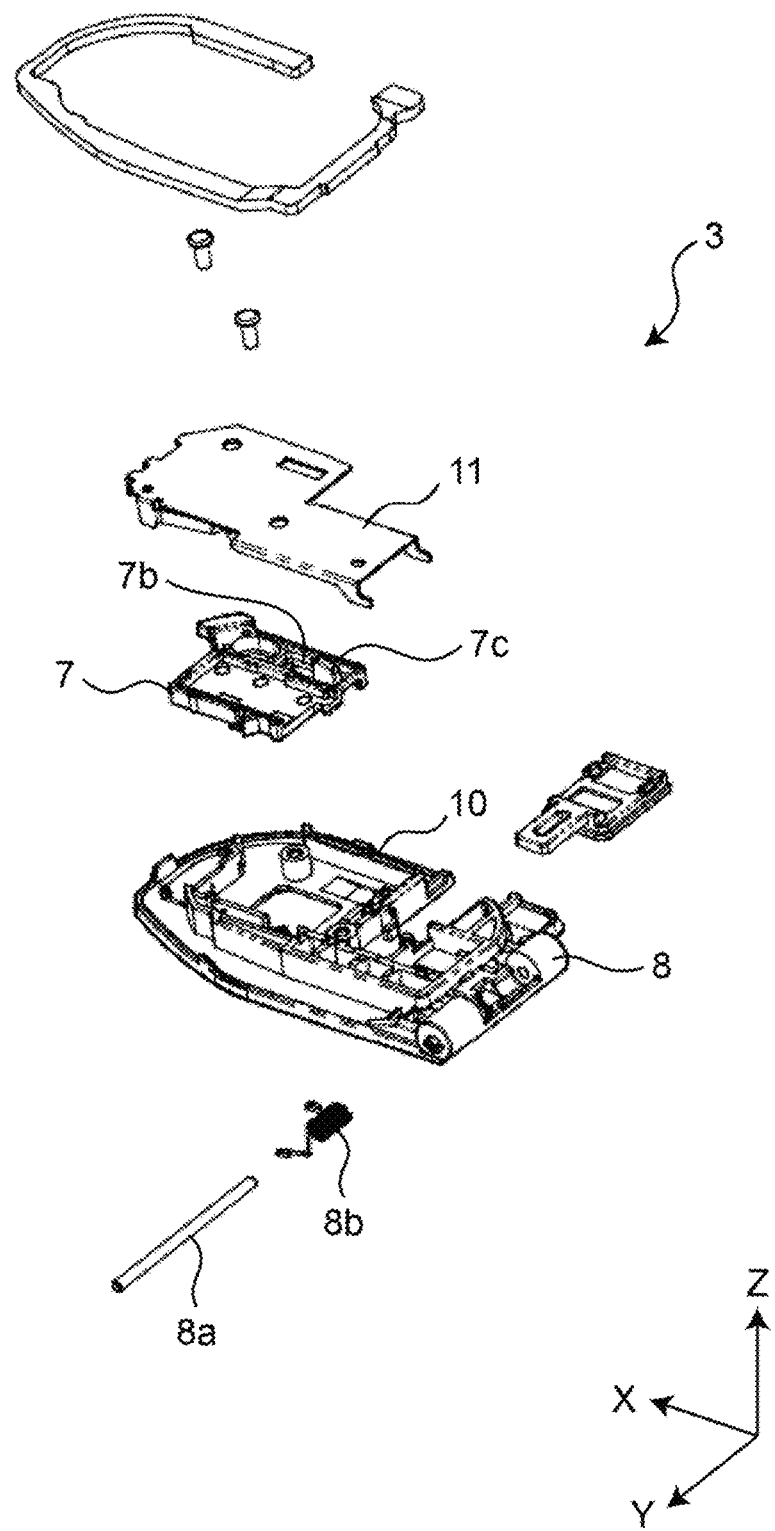
FIG. 9 is an exploded perspective view of the battery lid in the camera according to the first embodiment of the present disclosure.

FIGS. 8 and 9 are exploded perspective views of the battery lid 3 provided with the lock plate 7. FIG. 8 is an exploded perspective view of the battery lid 3 viewed from obliquely below, and FIG. 9 is an exploded perspective view of the battery lid 3 viewed from obliquely above. As shown in FIGS. 8 and 9, the hinge portion 8 is provided on the back surface side of a lid plate 10 of the battery lid 3. The hinge portion 8 includes a shaft 8a rotatable with respect to the camera casing 9, and a spring 8b for applying a biasing force in a direction in which the battery lid 3 is always opened. The battery lid 3 is provided with the lock plate 7 between the lid plate 10 and the lid back plate 11. The lock plate 7 is sandwiched between the lid plate 10 and the lid back plate 11, and is configured to be capable of reciprocating for a predetermined distance.

As described above, the lock plate 7 is provided with the knob portion 7a protruding to the bottom surface side and operable by the user. In the lid plate 10, the "OPEN" position and the "LOCK" position are displayed in the edge portion of an opening where the knob portion 7a is exposed, and the open state (non-lock state)/lock state of the battery lid 3 is displayed by the position of the knob portion 7a. Note that the protrusion portion of the knob portion 7a does not protrude beyond the lid plate 10, and the protrusion end portion of the knob portion 7a and the bottom surface of the camera 1 including the lid plate 10 are at least flush with each other.

The lock plate 7 is formed with an elastically deformable press arm portion 7b. The press arm portion 7b has a cantilever spring configuration, one end of which is joined to the lock plate 7 to be integrally formed, and the other end of which becomes a free end. Thus, the press arm portion 7b is rod-like shape and configured to be movable up and down. On the free end side of the press arm portion 7b, a convex press portion 7c protruding to the battery storage portion side is formed. As will be described later, the press portion 7c on the free end side of the press arm portion 7b is configured to be able to contact the bottom surface of the battery 5 stored and held when the battery lid 3 is closed. The lock plate 7 in the first embodiment is integrally formed of a rigid resin material, and the press arm portion 7b extending in a rod-like shape is configured to have a desired elastic force. The lock plate 7 is formed with a convex portion so as to generate a click sound when the knob portion 7a is operated to move between the "OPEN" position and the "LOCK" position, and the click sound is generated at the time of being operated to move, when the knob portion 7a runs on the convex portion of the lid back plate 11 disposed opposite to the convex portion of the lock plate 7.

[Lock Mechanism and Lock Operation of Lock Plate]

Figure 10:
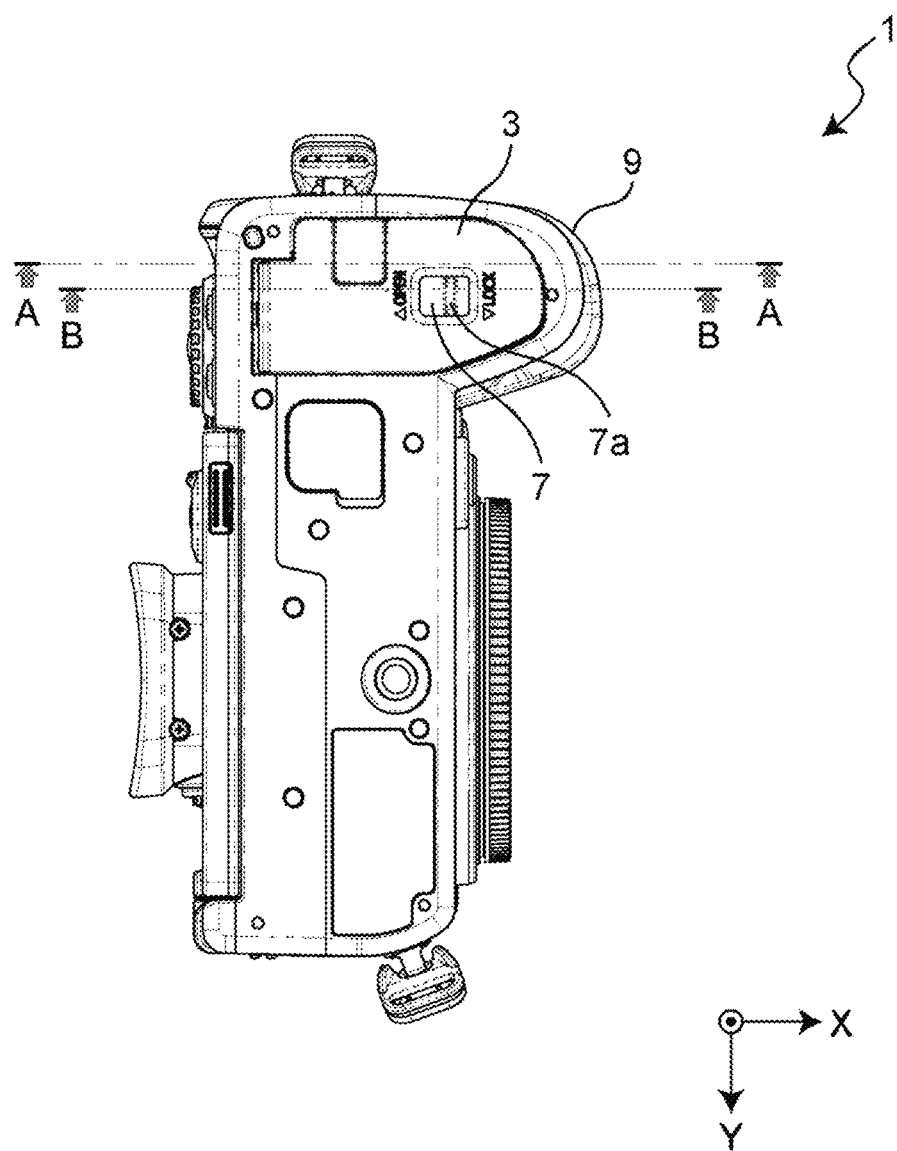
FIG. 10 is a bottom view of the camera according to the first embodiment of the present disclosure.

Next, the lock mechanism of the lock plate 7 will be described in detail with reference to FIGS. 10 to 16. FIG. 10 is a bottom view of the camera 1 of the first embodiment, showing that the knob portion 7a of the lock plate 7 is in the "LOCK" position. In FIG. 10, the position indicated by the broken line A-A is a cutting position in the cross-sectional views of FIGS. 11 to 13, and the position indicated by the broken line B-B is a cutting position in the cross-sectional views of FIGS. 14 to 16. On an assumption of a state in which the battery 5 is mounted to the battery storage portion 4, FIGS. 11 to 16 show the bottom surface side of the camera 1 to become the upper side. Note that FIG. 11, FIG. 12, FIG. 14, and FIG. 15 show a state in which a part of the camera casing 9 is removed, and FIG. 13 and FIG. 16 show a state in which a part of the camera casing is attached.

A normal lid closing operation performed by the user when mounting the battery 5 to the camera 1 is to insert the battery 5 into the battery storage portion 4, and, as described above, to lock the battery hold claw 6, which is the battery lock portion, to the bottom surface of the battery 5 to securely store and hold the battery 5 in the battery storage portion 4, before closing the battery lid 3. However, in some cases, the lid closing operation is performed by directly pressing the battery lid 3 against the battery 5 without locking the battery hold claw 6 to the bottom surface of the battery 5 with respect to the battery 5 inserted into the battery storage portion 4. If the battery 5 is not held in the predetermined battery hold position but is forcibly closed by the lid of the conventional configuration, as described above, the lid is subjected to a constant pressing force from the battery 5 and uplifted from the casing, and thus it is difficult to retain the desired external shape as a camera, and in some cases, there is a risk that the lid comes off and get damaged.

The configuration of the first embodiment of the present disclosure is a highly reliable configuration in which, even when the user presses the battery lid 3 against the bottom surface of the battery 5 to perform the lid closing operation as described above, the battery 5 is surely stored and held in a predetermined battery hold position, and the battery lid 3 is not constantly subjected to the pressing force from the stored and held battery 5.

The lock mechanism and lock operation of the lock plate 7, which will be described in detail with reference to FIGS. 11 to 16, show the lock operation when the user presses the battery lid 3 against the bottom surface of the battery 5 to perform the lid closing operation.

Figure 11:
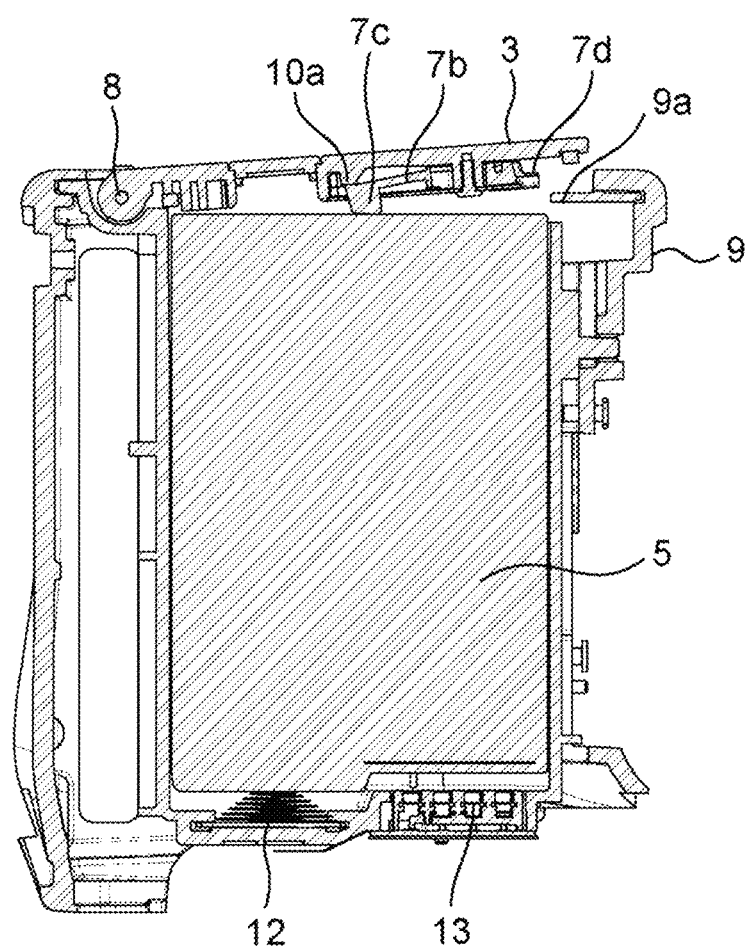
FIG. 11 is a cross-sectional view illustrating a lock mechanism and a lock operation in the camera according to the first embodiment of the present disclosure.

The state shown in FIG. 11 is a state in which, when the battery lid 3 is closed, the knob portion 7a of the lock plate 7 is in the "OPEN" position (first position: non-lock position), and the press portion 7c on the free end side of the press arm portion 7b is in contact with the bottom surface of the battery 5 stored and held in the battery storage portion 4. As shown in FIG. 11, when the knob portion 7a is in the "OPEN" position, the press portion 7c on the free end side of the press arm portion 7b is on a rib 10a formed on the lid plate 10. That is, in this state, the press portion 7c is not a free end. In FIG. 11, the upper side of the press portion 7c is supported by the rib 10a, and the movement of the press portion 7c upward (lid side) is restricted. As a result, when the battery lid 3 is closed and the press portion 7c comes into contact with the bottom surface of the battery 5, the press portion 7c presses the bottom surface of the battery 5 to push the battery 5 into the battery storage portion 4. At this time, in the battery storage portion 4, the bottom surface of the battery 5 moves to the battery hold position locked by the battery hold claw 6, which is a battery lock portion, or a position (battery push position) further pushed in from the battery hold position. Note that this battery push position may be the same as the battery hold position, and is only required to be a position where at least the bottom end portion of the battery 5 is securely locked to the battery hold claw 6.

As shown in FIG. 11, a back wall (lower end wall in FIG. 11) with which the battery 5 inserted in the battery storage portion 4 comes into contact is provided with a battery press spring 12 that is biased in a direction where the battery 5 is discharged, and a battery connection terminal 13 electrically connected to the stored and held battery 5. Therefore, when the battery 5 is in the battery hold position or the battery push position of the battery storage portion 4, the battery 5 receives a force in the direction of discharge and is electrically connected to the battery connection terminal 13.

Figure 12:
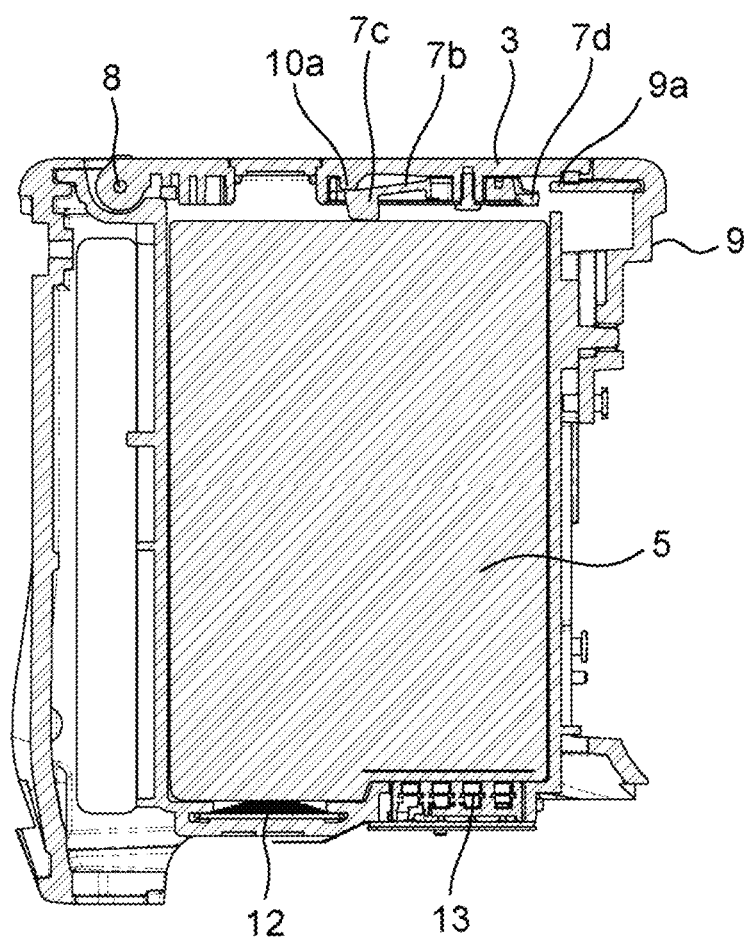
FIG. 12 is a cross-sectional view illustrating the lock mechanism and the lock operation in the camera according to the first embodiment of the present disclosure.
Figure 13:
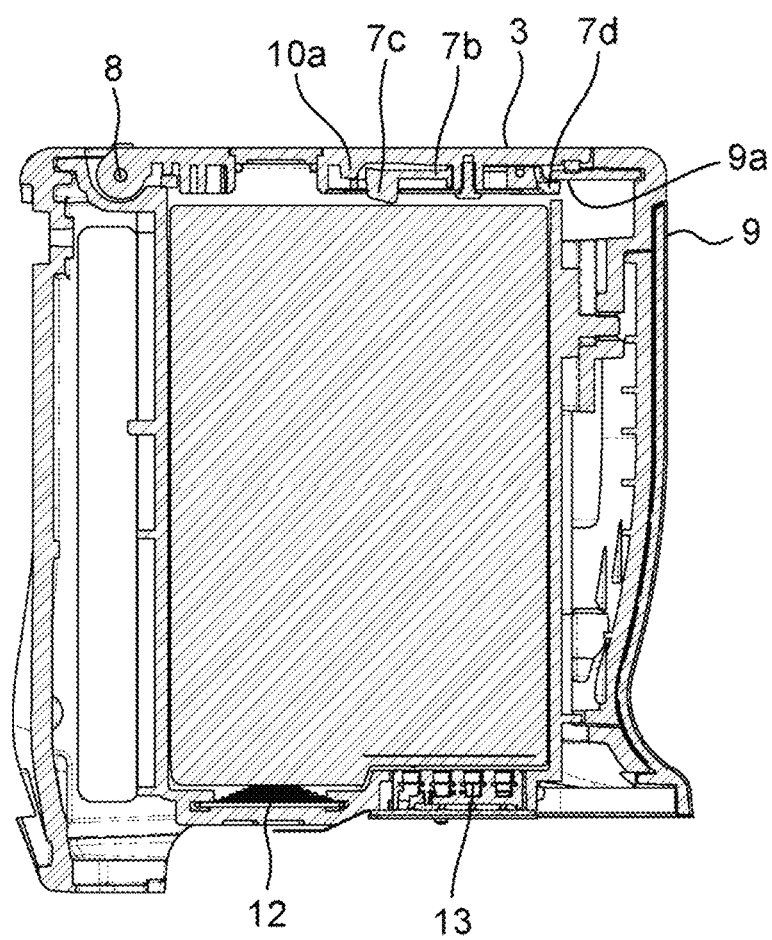
FIG. 13 is a cross-sectional view illustrating the lock mechanism and the lock operation in the camera according to the first embodiment of the present disclosure.

FIG. 12 is a cross-sectional view showing a state when the battery lid 3 is closed, the bottom surface of the battery 5 is pressed by the press portion 7c, and the battery 5 moves to the battery push position. In the state shown in FIG. 12, the knob portion 7a is in the "OPEN" position, and the press portion 7c is supported rearward by the rib 10a of the lid plate 10. At this time, the bottom end portion of the battery 5 is in a position where it can be locked with the battery hold claw 6 provided in the vicinity of the bottom portion (opening) of the battery storage portion 4. Alternatively, the bottom end portion of the battery 5 is in a position slightly pushed further from the lock position by the battery hold claw 6.

FIG. 13 shows a state in which the knob portion 7a is operated from the "OPEN" position to the "LOCK" position (second position) from the state shown in FIG. 12. As shown in FIG. 13, the press arm portion 7b moves, and the press portion 7c comes off from the rib 10a of the lid plate 10 to become into the free end state. That is, when the knob portion 7a moves from the "OPEN" position to the "LOCK" position, the press portion 7c having run on the rib 10a of the lid plate 10 comes off from the rib 10a to become into a state with no rear support of the rib 10a. As a result, the battery 5 stored in the battery storage portion 4 moves from at least the battery push position to the battery hold position. At this time, when the knob portion 7a moves from the "OPEN" position to the "LOCK" position, a lock portion 7d provided on the lock plate 7 protrudes to the camera casing side to be engaged with a casing lock portion 9a provided on the camera casing 9, and the battery lid 3 is securely locked to the camera casing 9. As a result, the battery 5 is locked by the battery hold claw 6 in a state of being pressed by the battery press spring 12 in the battery storage portion 4, and is surely stored and held in the battery hold position. At this time, the bottom surface side of the battery 5 is in a state where little pressing force is applied from the press portion 7c of the lock plate 7, and is simply in contact with the press portion 7c or has a gap with the press portion 7c.

On the other hand, the operation when moving the knob portion 7a of the lock plate 7 from the "LOCK" position to the "OPEN" position to open the battery lid 3 becomes reverse to the operation when closing the battery lid 3. That is, by moving the knob portion 7a from the "LOCK" position to the "OPEN" position, the press portion 7c runs on the rib 10a, and hence the battery 5 is shifted from the battery hold position to the battery push position, and the lock portion 7d comes off from the engagement with the casing lock portion 9a. Note that the contact surface of the rib 10a with the press portion 7c includes a slope inclined with respect to the moving direction of the lock plate 7 so that the press portion 7c easily and smoothly runs on the rib portion 10a when the lock plate 7 moves from the "LOCK" position to the "OPEN" position. A contact surface between the press portion 7c and the rib 10a may be formed by a slope, that is, a contact surface of the press portion 7c with the rib 10a may include a slope such as the slope of the rib 10a.

After that, when the lock plate 7 is in the "OPEN" position and the battery lid 3 is opened, the battery 5 is shifted from the battery push position to the battery hold position, and the battery 5 is locked by the battery hold claw 6 to maintain the state of being stored and held in the battery storage portion 4. Removal of the battery 5 is enabled by canceling the engagement with the battery hold claw 6, which is a battery lock portion.

Figure 14:
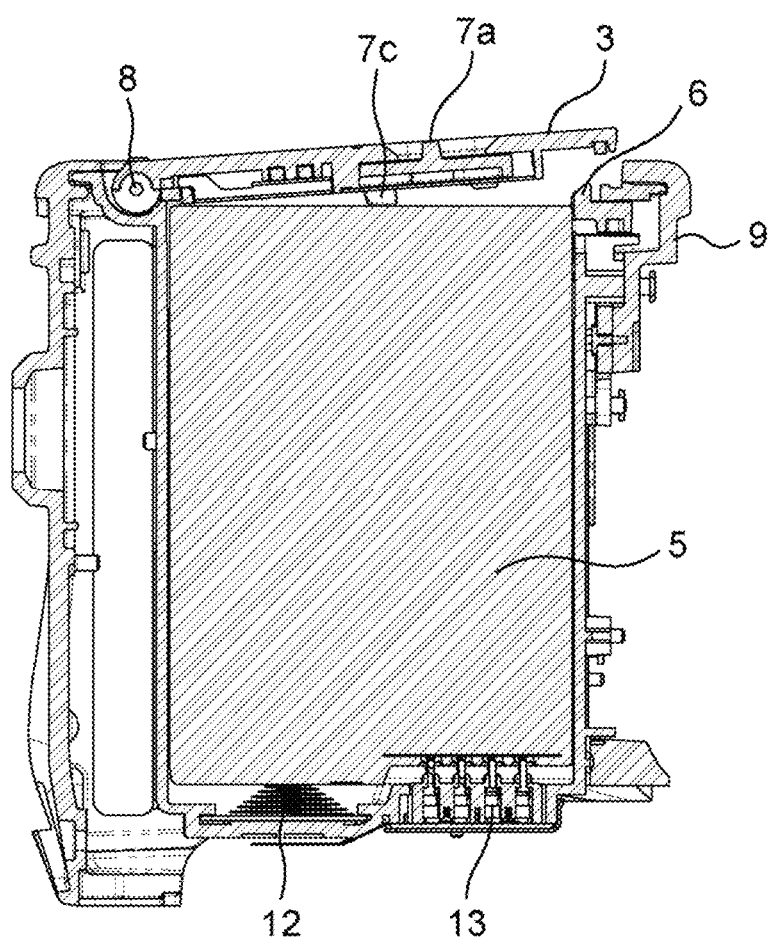
FIG. 14 is a cross-sectional view illustrating the lock mechanism and the lock operation in the camera according to the first embodiment of the present disclosure.
Figure 15:
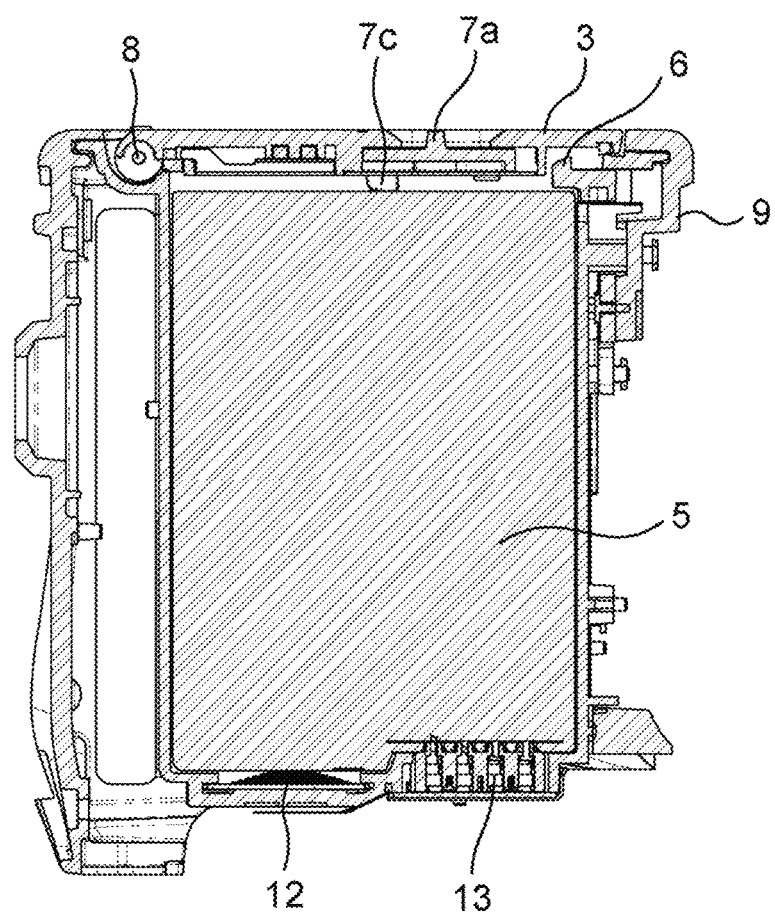
FIG. 15 is a cross-sectional view illustrating the lock mechanism and the lock operation in the camera according to the first embodiment of the present disclosure.
Figure 16:
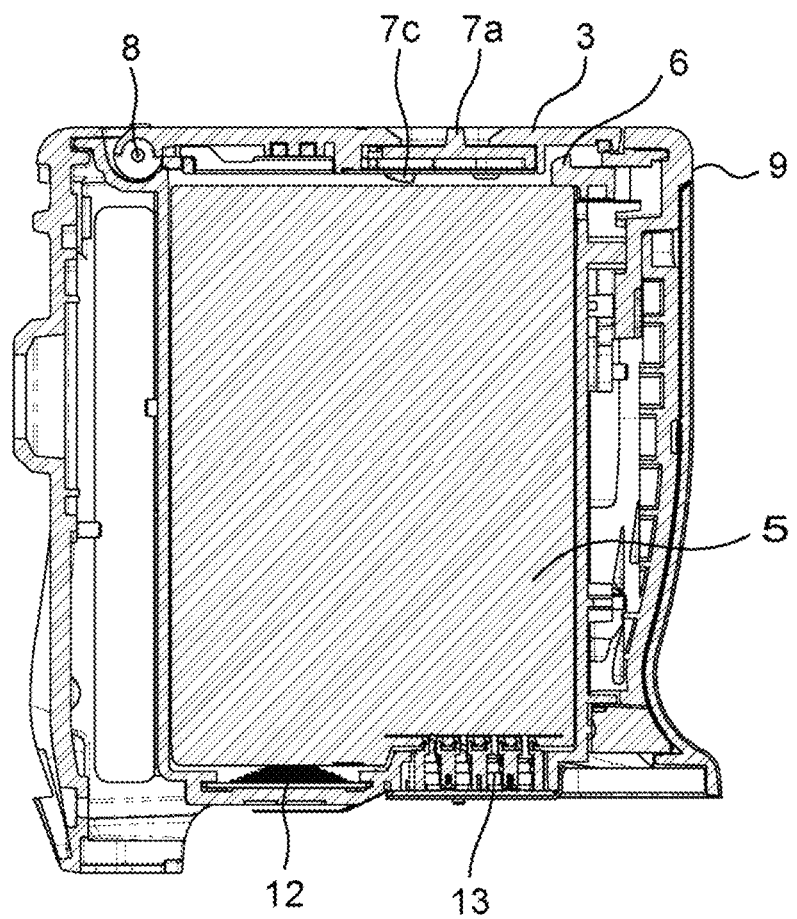
FIG. 16 is a cross-sectional view illustrating the lock mechanism and the lock operation in the camera according to the first embodiment of the present disclosure.

The operation of the lock plate 7 provided on the battery lid 3 and the battery hold claw 6, which is a battery lock portion provided in the battery storage portion 4, will be described with reference to FIGS. 14 to 16, showing cross-sectional views taken along the broken line B-B shown in FIG. 10.

The state shown in FIG. 14 is the same as the state shown in FIG. 11 described above, showing a state in which when the battery lid 3 is closed, the knob portion 7a of the lock plate 7 is in the "OPEN" position, and the press portion 7c of the press arm portion 7b is in contact with the bottom surface of the battery 5. The state shown in FIG. 14 is a state in which the press portion 7c runs on the rib 10a, and the press portion 7c is supported at its rear (upper side in FIG. 14) by the rib 10a. As a result, when the battery lid 3 is closed and the press portion 7c comes into contact with the bottom surface of the battery 5, the press portion 7c presses the bottom surface of the battery 5, pushes the battery 5, and moves the battery 5 to the battery push position through the battery hold position. Note that as described above, the battery hold position and the battery push position may be the same, and are only required to be a position where at least the bottom end portion of the battery 5 is securely locked to the battery hold claw 6.

The state shown in FIG. 15 is the same as the state shown in FIG. 12, and is a state in which the battery lid 3 is closed, the bottom surface of the battery 5 is pressed by the press portion 7c, and the battery 5 is moved to the battery push position. In the state shown in FIG. 15, the knob portion 7a is in the "OPEN" position, and a position where the battery hold claw 6 can be locked to the bottom end portion of the battery 5. Alternatively, the bottom end portion of the battery 5 is in the battery push position slightly pushed further from the lock position by the battery hold claw 6, and is disposed in a position with a slight gap between the bottom surface of the battery 5 and the battery hold claw 6.

The state shown in FIG. 16 is the same as the state shown in FIG. 13, and is a state in which the knob portion 7a is operated from the "OPEN" position to the "LOCK" position. As shown in FIG. 16, when the knob portion 7a moves from the "OPEN" position to the "LOCK" position, a lock portion 7d provided on the lock plate 7 protrudes to the camera casing side to be engaged with a casing lock portion 9a provided on the camera casing 9, and the battery lid 3 is securely locked to the camera casing 9. As a result, the battery 5 is locked by the battery hold claw 6 in a state of being pressed by the battery press spring 12 in the battery storage portion 4, and is surely held in the battery hold position.

On the other hand, the operation when moving the knob portion 7a of the lock plate 7 from the "LOCK" position to the "OPEN" position to open the battery lid 3 becomes reverse to the operation when closing the battery lid 3, and removal of the battery 5 is enabled by canceling the engagement with the battery hold claw 6, which is a battery lock portion.

In the configuration of the first embodiment, the movement of the battery lid 3 between the "OPEN" position, which is the first position of the lock plate 7, and the "LOCK" position, which is the second position, has been described with the slide operation, but the present disclosure is not limited to the slide operation, and the present disclosure may be configured to move between the first position and the second position by a rotation operation, for example.

As described in the first embodiment, the electronic device of the present disclosure is a highly reliable electronic device that stores and holds a battery as a drive power source, wherein the electronic device has a configuration in which a user can easily and surely attach/detach the battery to/from the electronic device, and the battery stored and held in the electronic device does not give an abnormal load or impact to a lid of its battery storage portion.

As described above, the embodiment has been described as an example of the technology in the present disclosure. To that end, the detailed description and the accompanying drawings have been disclosed. Hence, some of the components described in the detailed description and the accompanying drawings sometimes include components that are not essential for problem solution. Therefore, just because those non-essential components are described in the detailed description and the accompanying drawings does not mean that those non-essential components should be immediately recognized as essential.

Since the above embodiment is intended to illustrate the technology of the present disclosure, various modifications, substitutions, additions, omissions, and the like can be made within the scope of the claims or the equivalent thereof.

The present disclosure is to provide a product having high market value in an electronic device that stores and holds a battery as a drive power source, wherein the electronic device has a configuration in which a user can easily and surely attach/detach the battery to/from the electronic device.

What is claimed is:

1. An electronic device comprising:
   a battery storage portion that stores a battery;
   a battery lock portion that holds the battery stored in the battery storage portion in a battery hold position; and
   a battery lid that opens/closes the battery storage portion, wherein the battery lid includes;
      a lid plate having a rib, and
      a lock plate configured to be movable to a first position and a second position with respect to the lid plate,
   wherein the battery lock portion is formed in the battery storage portion, and
   in a state where the lock plate is in the first position and the battery lid is closed, the battery lid is in a first state in which the battery lid is pressed by the battery,
   when the lock plate moves from the first position to the second position with respect to the lid plate, the battery is locked by the battery lock portion, and the battery is stored and held in a predetermined battery hold position of the battery storage portion, and the battery lid changes from the first state to a second state in which the battery lid is suppressed from being pressed by the stored and held battery.

2. The electronic device according to claim 1, wherein the lock plate is configured to include:
   a knob portion serving as a handle for moving between the first position and the second position,
   a press portion that is restricted from moving in the first position by being supported by the rib of the lid plate, and that is free to move in the second position, and
   a lock portion that is engaged with the battery storage portion only in the second position, and
   when the lock plate is in the first position and the battery lid is closed, the press portion causes the battery to be disposed in the battery hold position with respect to the battery storage portion or in a battery push position where the battery is pushed into from the battery hold position.

3. The electronic device according to claim 2, wherein the lock plate is configured such that, by moving from the second position to the first position with respect to the lid plate, the press portion causes the battery to move to the battery push position from the battery hold position in the battery storage portion, and when the lock plate is in the first position and the lid plate is opened, the battery moves to the battery hold position thereby locking the battery by the battery lock portion.

4. The electronic device according to claim 2, wherein a contact surface between the press portion and the rib is formed by a slope such that the press portion runs on the rib when the lock plate moves from the second position to the first position.

5. The electronic device according to claim 2, wherein the press portion in the lock plate is configured to be provided on a free end side of an elastically deformable rod shape, one side of which is fixed, and another side of which is a free end, and is supported by the rib of the lid plate in the first position to be capable of pressing the battery in the battery storage portion, and is released from restriction by the rib of the lid plate in the second position to be capable of canceling press of the battery storage portion on the battery.

\* \* \* \* \*